United States Patent
Boerstler et al.

(10) Patent No.: US 7,958,469 B2
(45) Date of Patent: Jun. 7, 2011

(54) DESIGN STRUCTURE FOR A PHASE LOCKED LOOP WITH STABILIZED DYNAMIC RESPONSE

(75) Inventors: David W. Boerstler, Round Rock, TX (US); Eskinder Hailu, Sunnyvale, CA (US); Jieming Qi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 451 days.

(21) Appl. No.: 12/128,678

(22) Filed: May 29, 2008

(65) Prior Publication Data

US 2009/0007047 A1 Jan. 1, 2009

Related U.S. Application Data

(63) Continuation-in-part of application No. 11/770,867, filed on Jun. 29, 2007, now abandoned.

(51) Int. Cl.
*G06F 17/50* (2006.01)
*H03L 7/085* (2006.01)

(52) U.S. Cl. .......... 716/100; 716/126; 327/154; 331/25; 703/14

(58) Field of Classification Search ............. 716/12, 716/100, 126; 327/154; 331/25; 703/14
See application file for complete search history.

(56) References Cited

U.S. PATENT DOCUMENTS

| | | | |
|---|---|---|---|
| 5,870,003 A | 2/1999 | Boerstler | |
| 6,320,435 B1 | 11/2001 | Tanimoto | |
| 6,529,084 B1 | 3/2003 | Boerstler et al. | |
| 6,744,326 B2 | 6/2004 | Boerstler | |
| 6,816,019 B2 | 11/2004 | Delbo et al. | |
| 6,826,246 B1 | 11/2004 | Brown et al. | |
| 7,279,987 B1 * | 10/2007 | Kaszynski | 331/1 A |

OTHER PUBLICATIONS

Boerstler et al., "A 10+ GHz Low Jitter Wide Band PLL in 90 nm PD SOI CMOS Technology", VLSI Symposium Circuits Digest, Jun. 2006, pp. 228-231.
Maneatis, John G., "Low-Jitter Process-Independent DLL and PLL Based on Self-Biased Techniques", IEEE Journal of Solid-State Circuits, vol. 31, No, 11, Nov. 1996, pp. 1723-1732.
Gardner, Floyd M. "Charge-Pump Phase-Lock Loops", IEEE Trans. Comm., vol. COM-28, Issue 11, Nov. 1980, pp. 1849-1858.
"PLL Basics", Altera Corp., http://www.altera.com/support/devices/pll_clock/basics/pll-basics.html, 2 pages.

* cited by examiner

*Primary Examiner* — Vuthe Siek
*Assistant Examiner* — Magid Y Dimyan
(74) *Attorney, Agent, or Firm* — Stephen J. Walder, Jr.; Matthew B. Talpis

(57) ABSTRACT

A design structure for a hybrid phase locked loop (PLL) circuit that obtains stabilized dynamic response and independent adjustment of damping factor and loop bandwidth is provided. The hybrid PLL circuit of the illustrative embodiments includes the resistance/capacitance (RC) filter elements of a conventional RC PLL and the feed-forward path from the output of the phase frequency detector to the voltage controlled oscillator (VCO). The hybrid PLL essentially enhances the performance of the conventional feed-forward PLL by providing the RC filter whose components can be weighted to provide a dynamic response that is significantly less sensitive to parameter variation and which allows loop bandwidth optimization without sacrificing damping.

19 Claims, 6 Drawing Sheets

DESIGN STRUCTURE FOR A PHASE LOCKED LOOP WITH STABILIZED DYNAMIC RESPONSE

BACKGROUND OF THE INVENTION

1. Field of the Invention

The present application relates generally to a design structure and more specifically, to a design structure for a phase locked loop with stabilized dynamic response.

2. Background of the Invention

A phase locked loop (PLL) is a closed loop feedback control system that generates an output signal in relation to the frequency and phase of an input, or reference, signal. The PLL automatically responds to the frequency and phase of the input signal by raising or lowering the frequency of a controlled oscillator until it is matched to the reference in both frequency and phase.

PLLs are widely used in computing devices, telecommunications systems, radio systems, and other electronic applications where it is desired to stabilize a generated signal or to detect signals in the presence of noise. Since an integrated circuit can hold a complete PLL, the use of PLLs in modern electronic devices is widespread.

PLLs generally include a phase detector circuit, a low pass filter circuit, and a voltage controlled oscillator (VCO) placed in a negative feedback configuration. In addition to these elements, a frequency divider circuit may be provided in the feedback path, the reference signal path, or both, in order to make the PLL's output signal an integer multiple of the reference signal. The phase detector compares the phase of two inputs and outputs a corrective signal to control the VCO such that the phase difference between the two inputs becomes zero. The two inputs are a reference signal and the divided output of the VCO.

Various types of phase detector circuits are known including simple OR gates, four-quadrant multiplier (or "mixer") circuits, proportional phase detector circuits, and the like. A more complex phase detector uses a simple state machine to determine which of the two signals has a zero-crossing earlier or more often. This brings the PLL into lock even when it is off frequency. This type of phase detector circuit is known as a phase frequency detector (PFD).

The VCO is used to generate a periodic output signal. For example, if the VCO is at approximately the same frequency as the reference signal, if the phase of the VCO falls behind the phase of the reference signal, the phase detector circuit causes a charge pump of the PLL to charge the control voltage so that the VCO speeds up. Likewise, if the phase of the VCO progresses ahead of the phase of the reference signal, the phase detector circuit causes the charge pump to change the control voltage to slow down the VCO. The low-pass filter smooths out the abrupt control inputs from the charge pump. Since the frequency of the VCO may be far from the frequency of the reference signal, practical phase detectors may also respond to frequency differences, such as by using a phase frequency detector (PFD), so as to increase the lock-in range of allowable inputs.

As discussed above, most PLLs also include a frequency divider circuit between the VCO and the feedback input to the phase detector circuit in order to produce a frequency synthesizer. This frequency divider circuit may be programmable so as to achieve different output or feedback frequencies of the output signal. Some PLLs may also include a frequency divider circuit between the reference clock input and the reference input to the phase detector circuit. If this frequency divider circuit divides the frequency of the reference signal by M, the inclusion of this frequency divider circuit between the reference clock input and the reference input to the phase detector circuit allows the VCO to multiply the reference signal's frequency by N/M, where N is the multiplier provided by the VCO.

PLLs are used in a number of different ways in modern electronic systems. One use of PLLs is to provide clock signals for processors and other electronic devices. Typically, the clock signals supplied to these processors and other electronic devices come from clock generator PLLs which multiply a lower-frequency reference clock signal up to an operating frequency required by the processor or electronic device. Clock distribution logic may then distribute the clock signal generated by the PLL to various endpoints in the processor or electronic device.

Another use of PLLs is to provide a spread spectrum functionality to reduce interference with other electronic devices by spreading the energy of an input signal over a larger portion of the frequency spectrum of the PLL output. All electronic devices or systems emit some unwanted energy. Various regulatory agencies, such as the Federal Communications Commission (FCC), impose limits on this emitted energy and any interference it may cause on other electronic devices. This emitted interference, or noise, generally appears as sharp spectral peaks, usually at the operating frequency of the device generating the noise, and a few harmonics of this operating frequency. A system designer may use a spread-spectrum PLL to reduce interference with high-Q receivers by spreading the energy over a larger portion of the frequency spectrum of the PLL output. For example, by changing the operating frequency up and down by a small amount, a device running at hundreds of megahertz can spread its interference evenly over a few megahertz of spectrum. This drastically reduces the amount of noise seen by other electronic devices.

The dynamic responsiveness of a PLL is measured primarily with regard to the PLL's damping factor and loop bandwidth. The damping factor is a measure of how responsive the PLL is to changing the phase/frequency of the reference input signal. If a PLL takes too much time to adjust its response to achieve a desired phase/frequency, the PLL is over-damped. If the PLL tends to oscillate towards its desired phase/frequency, then the PLL is under-damped. A PLL that does not overshoot the desired phase/frequency and achieves the desired phase/frequency within a minimum period of time is determined to be critically damped.

The loop bandwidth represents the frequencies of reference signals or input signals that the PLL will detect. The PLL acts as a filter meaning that input signals having a frequency within a specific range will be detected for adjustment by the PLL. Other input signals outside of the range, or bandwidth, will not be detected by the circuitry of the PLL and thus, are essentially filtered-out. Large loop bandwidth PLLs tend to lock onto the reference input signal more quickly than small loop bandwidth PLLs. Small loop bandwidth PLLs take longer to lock, but are able to filter out more noise or jitter.

Phase locked loop (PLL) circuits for applications, such as processor core clock generation, usually require damping factors between 0.5 and 1.0, 1.0 being a critically damped PLL circuit, and loop bandwidths of at least 100 times the spread spectrum modulation frequency for proper spread spectrum tracking with no additional spread spectrum induced jitter penalty, e.g., 50 KHz modulation frequency means 5 MHz minimum PLL bandwidth is required. However, excessive PLL bandwidth will cause larger jitter due to external noise. Thus, it is important to optimize the bandwidth of a PLL circuit so as to obtain as small a PLL bandwidth as possible, while still providing proper spread spectrum tracking. Moreover, it is important to obtain as close to an optimal damping factor as possible with PLL circuits.

While PLLs provide the ability to adjust the phase and frequency of input signals, the dynamic responsiveness of PLLs must be selected carefully to meet the requirements of the system in which they are utilized. Optimization of the dynamic response of PLLs is often very difficult to achieve because the damping factor and natural frequency/loop bandwidth cannot be set independently for conventional PLL designs. That is, in conventional PLL designs, any modification to the damping factor of the PLL will also cause a modification in the loop bandwidth. Similarly, modifications to the loop bandwidth will cause a change in the damping factor of the PLL. It is not currently possible to adjust one dynamic response parameter of a PLL independently of the other.

BRIEF SUMMARY OF THE INVENTION

The mechanisms of the illustrative embodiments provide a hybrid phase locked loop (PLL) circuit for obtaining stabilized dynamic response and independent adjustment of damping factor and loop bandwidth. The hybrid PLL circuit of the illustrative embodiments includes the resistance/capacitance (RC) filter elements of a conventional RC PLL and the feed-forward path from the output of the phase frequency detector to the voltage controlled oscillator (VCO). The hybrid PLL essentially enhances the performance of the conventional feed-forward PLL by providing the RC filter whose components can be weighted to provide a dynamic response that is significantly less sensitive to parameter variation and which allows loop bandwidth optimization without sacrificing damping.

The hybrid PLL takes advantage of the fact that the natural frequency relationships for the RC PLL and the feed-forward PLL are identical, but the damping factor for the RC PLL is directly proportional to the square root of the charge pump current while the damping factor for the feed-forward PLL is inversely proportional to the square root of the charge pump current. Thus, by creating a hybrid PLL which has both RC filtering and feed-forward operations, the mechanisms of the illustrative embodiments create a circuit with a damping factor in which components of the damping factor offset each other as the charge pump current is varied. As a result, the damping factor of the hybrid PLL may be made insensitive to charge pump current. Therefore, the damping factor and natural frequency/bandwidth can be set independently of each other.

In one illustrative embodiment, a phase locked loop circuit is provided that comprises a phase frequency detector, a charge pump coupled to the phase frequency detector, a filter coupled to the charge pump (the filter comprising a resistor) an oscillator coupled to the filter, and a feed-forward path coupled to the phase frequency detector and the oscillator. The filter may further comprise a capacitor coupled to the resistor. By virtue of the resistor and the feed-forward path, a damping factor and a bandwidth of the phase locked loop circuit may be independently set.

The phase frequency detector may receive as inputs a reference signal and a feedback signal. The phase frequency detector may generate and provide a control signal input to the charge pump to thereby increase or decrease a current of the charge pump based on a detected difference in at least one of phase or frequency of the reference signal and the feedback signal. The control signal input generated by the phase frequency detector may be provided to the oscillator via the feed-forward path and to the charge pump.

The resistor and the feed-forward path may generate components used in the determination of the damping factor of the phase locked loop circuit that offset each other as charge pump current is varied. The damping factor of the phase locked loop circuit may be insensitive to charge pump current due to the inclusion of both the feed-forward path and the resistor in the filter.

The phase locked loop circuit may provide a frequency modulation for a spread spectrum integrated circuit device. The oscillator may provide a clock signal output to an integrated circuit device. The integrated circuit device may be a processor and the clock signal output may be a core clock signal for the processor.

In another illustrative embodiment, an integrated circuit device is provided that comprises a plurality of functional units and a phase locked loop circuit that generates an internal signal for synchronizing the plurality of functional units. The phase locked loop circuit may comprise a phase frequency detector, a charge pump coupled to the phase frequency detector, a filter coupled to the charge pump (the filter comprising a resistor), an oscillator coupled to the filter, and a feed-forward path coupled to the phase frequency detector and the oscillator. The filter may further comprise a capacitor coupled to the resistor. By virtue of the resistor and the feed-forward path, a damping factor and a bandwidth of the phase locked loop circuit may be independently set.

The phase frequency detector may receive as inputs a reference signal and a feedback signal. The phase frequency detector may generate and provide a control signal input to the charge pump to thereby increase or decrease a current of the charge pump based on a detected difference in at least one of phase or frequency of the reference signal and the feedback signal. The control signal input generated by the phase frequency detector may be provided to the oscillator via the feed-forward path and to the charge pump.

The resistor and the feed-forward path may generate components used in the determination of the damping factor of the phase locked loop circuit that offset each other as charge pump current is varied. The damping factor of the phase locked loop circuit may be insensitive to charge pump current due to the inclusion of both the feed-forward path and the resistor in the filter.

The integrated circuit device may be a spread spectrum integrated circuit device and the phase locked loop circuit provides a frequency modulation for the spread spectrum integrated circuit device. Moreover, the integrated circuit device may be a processor of a data processing device.

In yet another illustrative embodiment, a method of generating an output signal based on a reference input signal is provided. The method may comprise receiving a reference input signal, comparing the reference input signal to a feedback signal, and generating a charge pump input signal for controlling an increase, decrease, or maintaining of an input voltage to a voltage controlled oscillator based on results of the comparison. The method may further comprise inputting the charge pump input signal to a charge pump that generates a control input signal for controlling an operation of the voltage controlled oscillator and inputting the control input signal to a filter which generates a filtered control input signal that is input to the voltage controlled oscillator. Moreover, the method may comprise inputting the charge pump input signal to the voltage controlled oscillator and generating, by the voltage controlled oscillator, an output signal based on the charge pump input signal and the filtered control input signal.

In another illustrative embodiment, a design structure embodied in a machine readable medium for designing, manufacturing, or testing an integrated circuit is provided.

The design structure may be encoded on a machine-readable data storage medium and may comprise elements that, when processed in a computer-aided design system, generates a machine-executable representation of a phase locked loop circuit. The design structure may be a hardware description language (HDL) design structure. The design structure may comprise a netlist and may reside on a storage medium as a data format used for the exchange of layout data of integrated circuits.

In yet another illustrative embodiment, a method in a computer-aided design system for generating a functional design model of a phase locked loop circuit is provided.

These and other features and advantages of the present invention will be described in, or will become apparent to those of ordinary skill in the art in view of, the following detailed description of the exemplary embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION OF THE INVENTION

Figure 1:
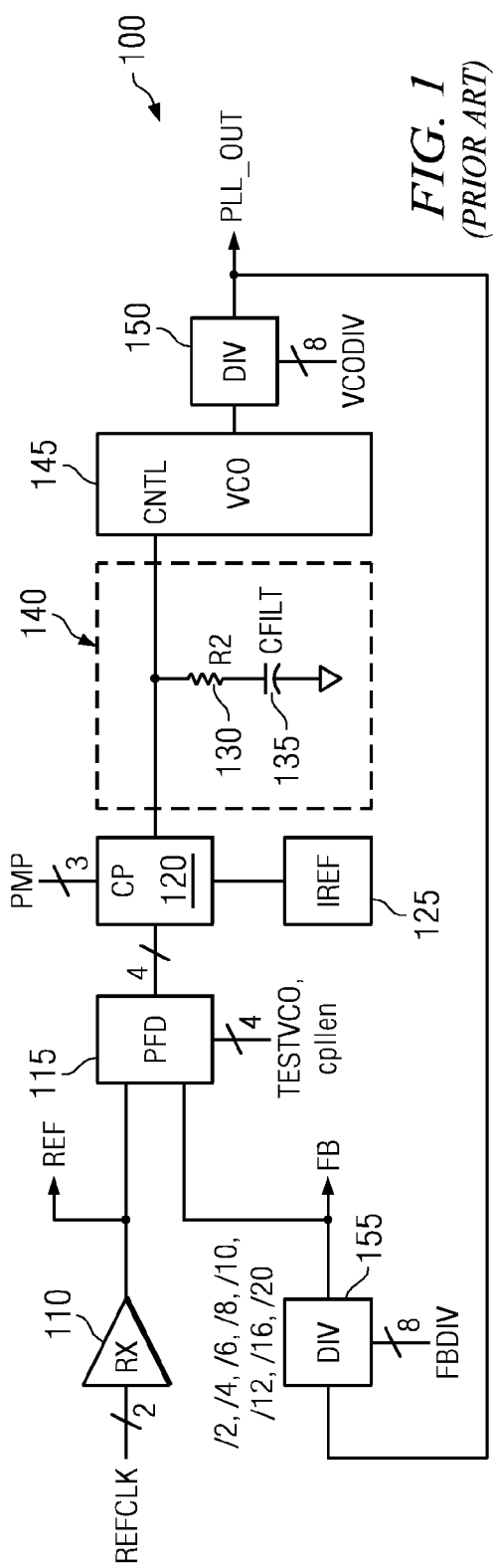
FIG. 1 is an exemplary block diagram of a conventional RC phase locked loop (PLL) circuit.

FIG. 1 is an exemplary block diagram of a conventional RC phase locked loop (PLL) circuit. As shown in FIG. 1, the conventional RC PLL circuit 100 includes a receiver (RX) 110 coupled to a phase frequency detector (PFD) 115 which is in turn coupled to a charge pump (CP) 120. A reference current signal from a reference current circuit (IREF) 125 is provided as an input to the charge pump 120 along with a control input, via a PMP bus for example, specifying the setting of the charge pump 120. The control input, which is set by a configuration register or is hard-wired into the circuit, sets the peak current for the charge pump 120. The charge pump is coupled to a resistor (R2) 130 and capacitor (CFILT) 135 which together constitute a resistance/capacitance (RC) filter 140 (also sometimes referred to as a "loop filter"). The RC filter 140 is coupled to a voltage controlled oscillator (VCO) 145 which in turn is coupled to a first divider 150. A feedback path is provided back to the input of the PFD 115 via a second divider 155.

The conventional RC PLL circuit 100 operates in a manner generally known in the art. That is, assuming the RC PLL circuit 100 is used for generating a core clock signal for a processor or other integrated circuit device, a reference clock signal is provided to the RC PLL circuit 100 via receiver 110. Preferably, the input to the receiver 110 is coupled to an external reference clock while the output of the first divider 150 is coupled to a clock input of a processor or other integrated circuit device. This reference clock signal is input to the phase frequency detector 115 which also receives as an input a feedback clock signal from the second divider 155, which divides the feedback signal from the first divider 150 by a programmable amount. The phase frequency detector 115 compares the feedback clock signal from the second divider 155 and detects a difference in phase and frequency between the reference clock signal and the feedback clock signal. The phase frequency detector 115 then generates an "up" or "down" control signal based on whether the feedback clock signal frequency is lagging or leading the reference clock signal frequency. These "up" or "down" control signals determine whether the VCO 145 needs to operate at a higher or lower frequency, respectively.

The PFD 115 outputs these "up" and "down" signals to the charge pump 120. If the charge pump 120 receives an "up" control signal, current is driven into the RC filter 140. Conversely, if the charge pump 120 receives a "down" control signal, current is drawn from the RC filter 140. The RC filter 140 converts these control signals into a control voltage that is used to bias the VCO 145. Based on the control voltage, the VCO 145 oscillates at a higher or lower frequency, which affects the phase and frequency of the feedback clock signal. If the PFD 115 produces an "up" control signal, then the VCO 145 frequency is increased. If the PFD 115 produces a "down" control signal, then the VCO 145 frequency is decreased. The VCO stabilizes once the reference clock signal and the feedback clock signal have the same phase and frequency. When the reference clock signal and the feedback clock signal are aligned, the RC PLL circuit 100 is considered locked.

The RC filter 140 operates to filter out jitter from the charge pump 120 output and to prevent voltage overshoot. Thus, the operation of the RC filter 140 affects the damping factor of the RC PLL circuit 100. The first and second dividers 150 and 155 operate to increase the VCO 145 frequency above the reference frequency of the reference clock signal. That is, the VCO 145 frequency is equal to a multiple of the reference clock signal frequency which may then be reduced by the divider circuits 150 and 155.

The PLL shown in FIG. 1 and described at length above is a conventional analog circuit PLL. The design of RC PLLs is relatively straight forward and relatively less complex than other alternatives. However, implementing high quality/precision resistors in Complementary Metal-Oxide Semiconductor (CMOS) is an expensive process requiring additional process steps with the resulting resistors taking up a large chip area. Moreover, it is difficult to form resistors using CMOS technology because of variations in process. As a result, the conventional feed-forward PLL was developed to eliminate the need for the resistor in the RC filter 140.

Figure 2:
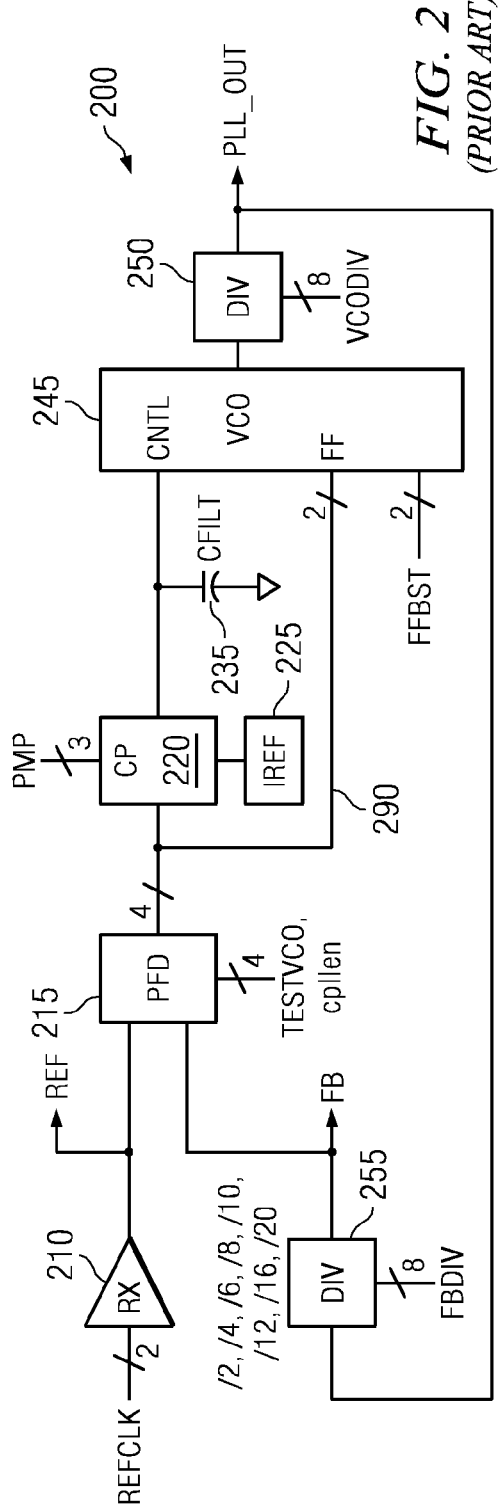
FIG. 2 is an exemplary block diagram of a conventional feed-forward PLL circuit.

FIG. 2 is an exemplary block diagram of a conventional feed-forward PLL circuit. The architecture of the conventional feed-forward PLL circuit 200 in FIG. 2 is similar to the architecture of the conventional RC PLL circuit 100 in FIG. 1 with two major exceptions. The first is that the resistor R2 in the RC filter 140 is removed from the conventional feed-forward PLL circuit 200. The second is that a feed-forward line 290 from the phase frequency detector 215 to the VCO 245 is provided. This feed-forward line 290 provides an equivalent resistance to the resistor R2 of the RC filter 140 in the conventional RC PLL circuit 100 in FIG. 1. The feed-forward line 290 allows the error signals from the PFD 215 to dither the frequency of the VCO 245. This modulation is similar to that introduced by the resistor and capacitor current of the RC filter 140.

Figure 3:
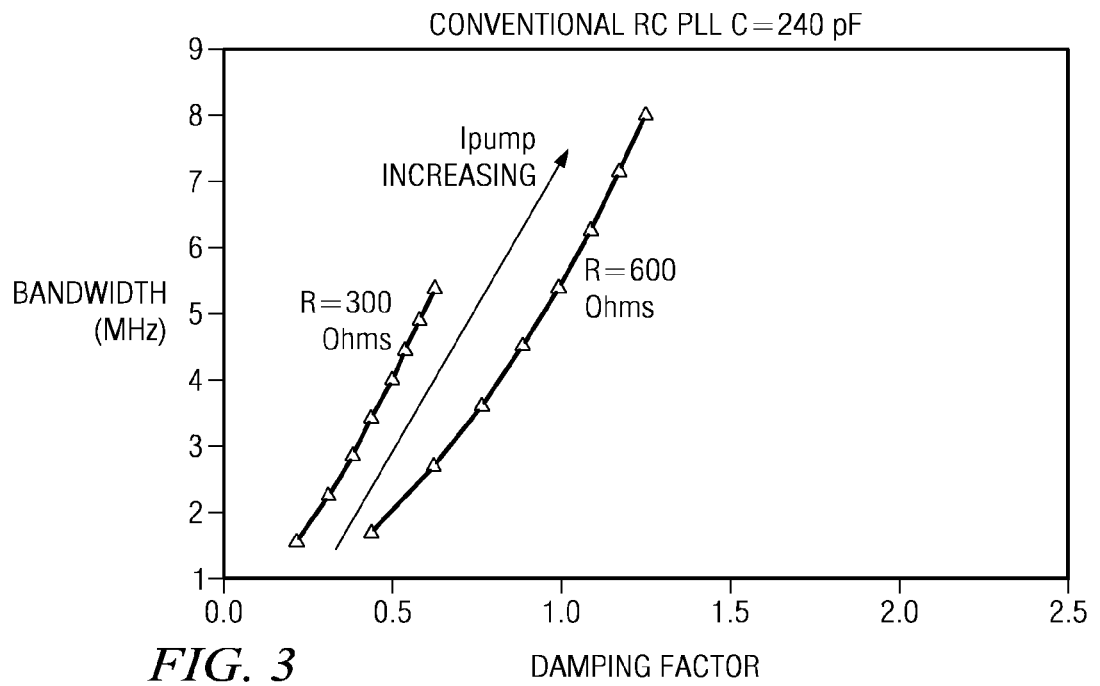
FIG. 3 is a plot of loop bandwidth and damping factor for a conventional RC PLL circuit such as illustrated in FIG. 1.

FIG. 3 is a plot of loop bandwidth and damping factor, i.e. the dynamic properties, for a conventional RC PLL circuit such as illustrated in FIG. 1. The plot shows loop bandwidth versus damping factor for two different filter resistors, i.e. two different resistors R2 130 in FIG. 1. The capacitance of the capacitor CFILT 135 is 240 pF for each of these two different filter resistor values of 300 Ohms and 600 Ohms. The ticks along each of the curves shown in FIG. 3 represent different charge-pump currents which may be selected for the conventional RC PLL circuit 100, with lowest currents at the bottom left of the plot and increasing toward the upper right of the plot.

As discussed above, it is desirable to obtain a damping factor of 0.5 to 1.0 in the PLL since the PLL will tend not to overshoot the target phase/frequency (i.e. be under-damped) and will not take too long to achieve the target phase/frequency (i.e. be over-damped). A critically damped PLL is achieved when the damping factor is 1. Thus, using a 600 Ohm resistor, a critically damped RC PLL can be achieved at a loop bandwidth of approximately 5.5 MHz which corresponds to the fifth highest charge pump current setting. Variations in charge pump current, as well as other design parameters such as VCO gain (not shown in the plot), cause significant deviation from the nominal setting. Thus, it is important to stabilize these parameters as much as possible. However, the circuit designer usually has limited influence since process variation and modeling errors are quite large and may cause the performance/operation of the circuit to be far from the intended (optimal) case.

Moreover, damping factor and loop bandwidth are dependent upon each other in the known RC PLL architecture such that a change in one causes a change in the other, as illustrated in the plot shown in FIG. 3. That is, if the loop bandwidth is adjusted to achieve greater noise reduction or less noise reduction, following the curves shown in FIG. 3, the damping factor is also adjusted toward or away from a critical damping state. It is not possible with the RC PLL architecture to adjust the loop bandwidth and the damping factor independently of each other.

Figure 4:
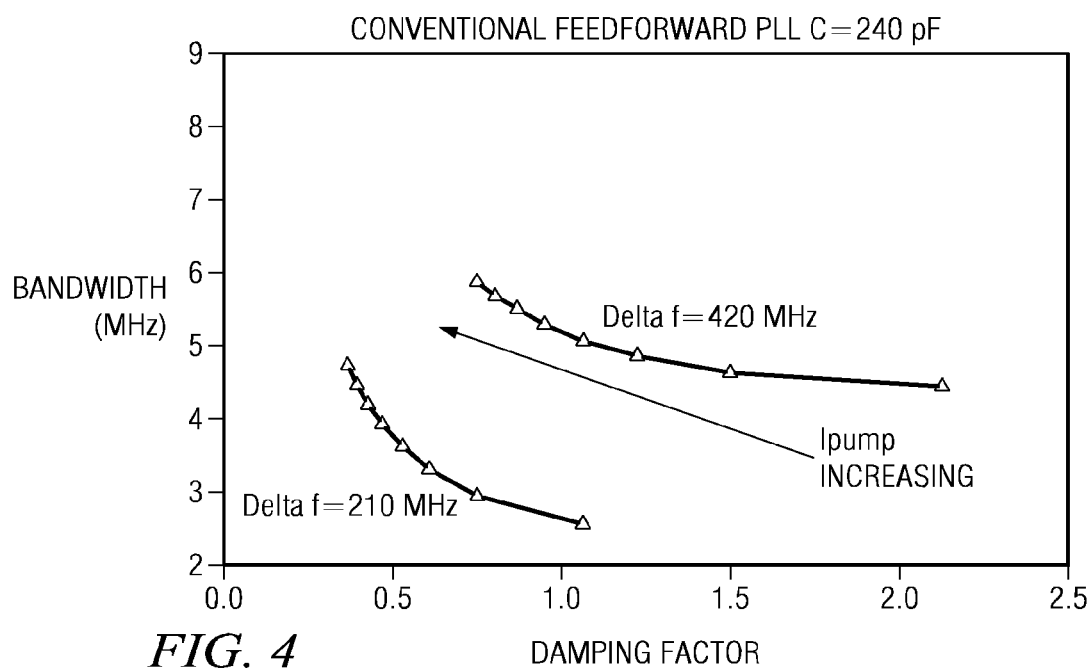
FIG. 4 is a plot of loop bandwidth and damping factor for a conventional feed-forward PLL circuit such as illustrated in FIG. 2.

FIG. 4 is a plot of loop bandwidth and damping factor for a conventional feed-forward PLL circuit such as illustrated in FIG. 2. The plot shows loop bandwidth versus damping factor for two different frequency dithers, e.g., 210 MHz and 420 MHz, which are used to provide damping in the feed-forward PLL architecture rather than discrete resistor values. The capacitance of the capacitor CFILT 235 in FIG. 2 is 240 pF for each of these two different frequency dither values. The ticks along each of the curves shown in FIG. 4 again represent different charge pump currents which may be selected for the conventional feed-forward PLL circuit 200, with lowest currents at the bottom right of the plot and increasing toward the upper left of the plot.

In the plot shown in FIG. 4, performance comparable to the design of FIG. 3 can be achieved using the 420 MHz feed-forward frequency dither with the fourth or fifth charge pump setting. As with the example shown in FIG. 3, variation in charge pump current and/or other parameters significantly alters the dynamic performance of the conventional feed-forward PLL circuit 200. Moreover, again the loop bandwidth and damping factor are dependent upon each other such that a modification of one causes a change in the other as illustrated by the depicted curves.

Both the example in FIG. 4 and the example in FIG. 3 show that optimization of both parameters, i.e. damping factor and loop bandwidth, simultaneously is very difficult and the operating point is very sensitive to design parameters. Thus, it is desirable to achieve a new architecture that facilitates simultaneous optimization of damping factor and loop bandwidth in such a way that these parameters are independently adjustable. The mechanisms of the illustrative embodiments achieve such an architecture by providing a hybrid PLL that utilizes the feed-forward characteristics and RC filtering characteristics of known PLL architectures in combination to achieve a new PLL architecture that is not as sensitive to parameter variations and allows bandwidth optimization without sacrificing damping factor.

It should be appreciated that a hybrid PLL architecture was not known prior to the present invention since the relationship between damping factor and loop bandwidth was not fully appreciated and thus, there was no motivation to attempt to generate such a hybrid PLL. To the contrary, if a designer has access to a precision resistor process, and cost is not as much of an issue, then one would generally use the known RC PLL architecture. Feed-forward PLLs, on the other hand, are more complex and require a VCO that is modified to accommodate the feed-forward input. Without an understanding of the relationship between the feed-forward operation of a feed-forward PLL, the RC filtering of an RC PLL, and their affect on damping factor and loop bandwidth, one would have no motivation to combine the feed-forward and RC PLL architectures into a hybrid PLL architecture such as that set forth in the illustrative embodiments herein.

Figure 5:
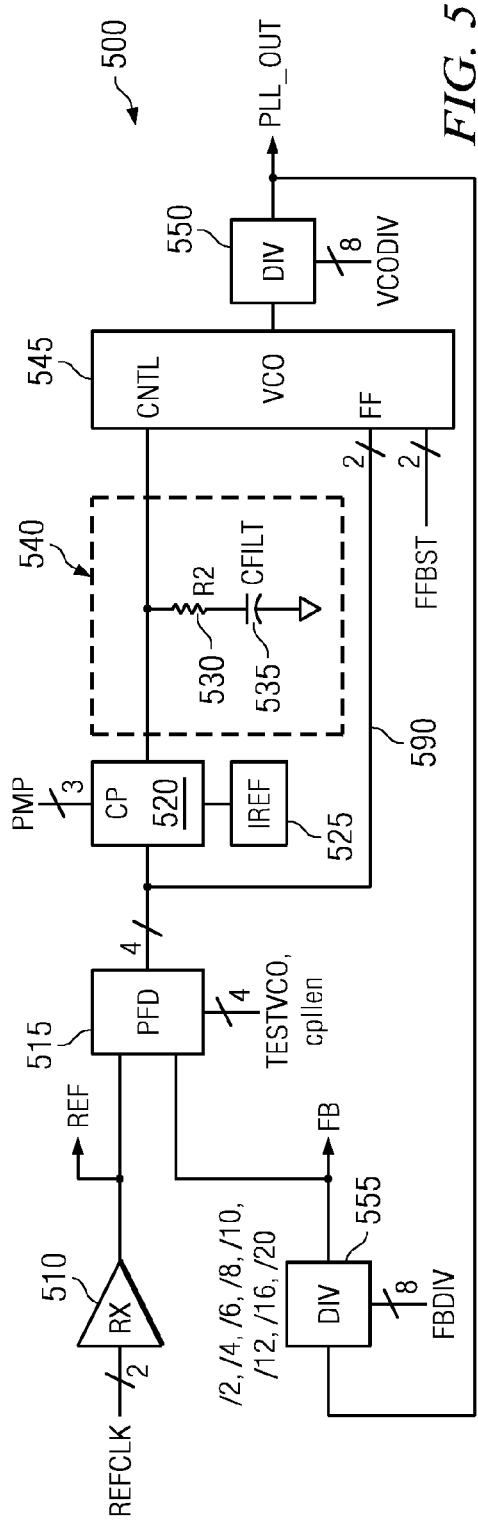
FIG. 5 is an exemplary block diagram of a hybrid PLL circuit in accordance with one illustrative embodiment.

FIG. 5 is an exemplary block diagram of a hybrid PLL circuit in accordance with one illustrative embodiment. As shown in FIG. 5, the hybrid PLL 500 includes a receiver (RX) 510 coupled to a phase frequency detector (PFD) 515 which is in turn coupled to a charge pump (CP) 520. A reference current signal from a reference current circuit (IREF) 525 is provided as an input to the charge pump 520 along with a control input, such as via a PMP bus, specifying the setting of the charge pump 520. The charge pump is coupled to a resistor (R2) 530 and capacitor (CFILT) 535 which together constitute a resistance/capacitance (RC) filter 540 (also sometimes referred to as a "loop filter"). The RC filter 540 is coupled to a voltage controlled oscillator (VCO) 545 which in turn is coupled to a first divider 550. A feedback path is provided back to the input of the PFD 515 via a second divider 555. These elements and their connections are similar to the conventional RC PLL circuit 100 in FIG. 1.

In addition to these elements, a feed-forward line 590 is provided between the PFD 515 and the VCO 545 in a similar manner to that of the conventional feed-forward PLL circuit 200 in FIG. 2. With this hybrid architecture, the resistor R2 530 and the feed-forward line 590 generate components in the mathematical relationships used in the determination of the damping factor of the hybrid PLL 500 that offset each other as charge pump current is varied, as discussed in greater detail hereafter. As a result, the damping factor of the hybrid PLL 500 may be made insensitive to charge pump current. Thus, the damping factor and the natural frequency/bandwidth of the hybrid PLL 500 may be set independently.

The ability to independently set the damping factor and natural frequency/bandwidth of the hybrid PLL 500 is especially important to spread spectrum applications. As discussed above, with spread spectrum applications it is desirable to achieve a damping factor of approximately 0.5 to 1.0 while being able to adjust the bandwidth to achieve a proper spread spectrum modulation frequency while reducing jitter due to external noise. The mechanisms of the hybrid PLL 500 allow the damping factor to be set to a desired level, e.g., damping factor of 1, and then to allow the bandwidth to be adjusted while maintaining the set damping factor. In this way, the bandwidth may be adjusted to achieve a proper spread spectrum modulation frequency while reducing jitter due to external noise by setting the bandwidth to a level that is small enough to reduce the jitter detected by the hybrid PLL 500 but large enough to provide the proper spread spectrum modulation frequency.

As an example, consider a situation where a 50 KHz modulation frequency is desired. According to Federal Communications Commission (FCC) regulations, a minimum of 100 times the spread spectrum modulation frequency is required for proper spread spectrum tracking with no spread spectrum induced jitter penalty. Thus, a minimum of 5 MHz of loop bandwidth is required so that the noise may be spread out over this range of frequencies. With the mechanisms of the illustrative embodiments, for the same resistance value and feed-forward delta f values, any of a number of various bandwidths, and thus, modulation/natural frequencies may be selected while still achieving a critically damped PLL. Thus, the same hybrid PLL circuit may be used with various required modulation frequencies and bandwidths leading to a more versatile circuit.

Figure 6:
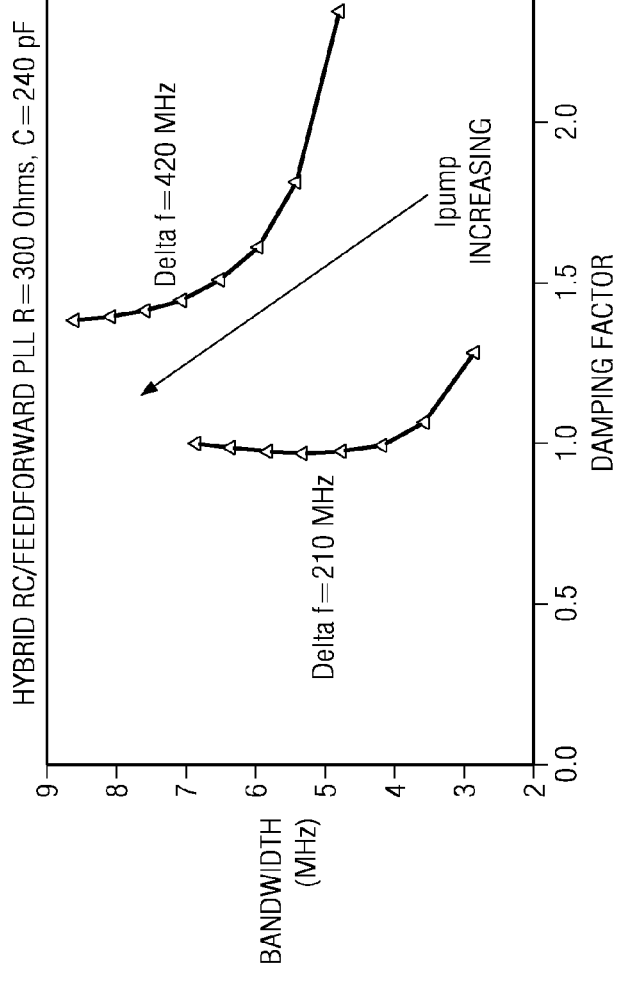
FIG. 6 is a plot of loop bandwidth and damping factor for a hybrid PLL circuit in accordance with one illustrative embodiment.

FIG. 6 is a plot of loop bandwidth and damping factor for a hybrid PLL circuit, such as hybrid PLL 500 in FIG. 5, in accordance with one illustrative embodiment. The plot shows loop bandwidth versus damping factor for two different frequency dithers, e.g., 210 MHz and 420 MHz, which are used to provide damping in the feed-forward PLL architecture rather than discrete resistor values. The resistance of the resistor 530 in FIG. 5 is set to 300 Ohms for purposes of this example. The capacitance of the capacitor CFILT 535 in FIG. 5 is 240 pF for each of these two different frequency dither values. The ticks along each of the curves shown in FIG. 6 again represent different charge-pump currents which may be selected for the hybrid PLL 500, with lowest currents at the bottom right of the plot and increasing toward the upper left of the plot.

As shown in FIG. 6, the proper weighting of filter components, i.e. resistance value and feed-forward delta f value, can produce a dynamic response that is significantly less sensitive to parameter variation and which allows bandwidth optimization without sacrificing damping. In the depicted example, a weighting of 210 MHz feed-forward delta f in combination with a 300 Ohm resistor in the RC filter can achieve critical damping over a wide range of bandwidths, e.g., 4 MHz to 7 MHz. Thus, a designer may adjust the bandwidth anywhere in this range, to achieve a desired spread spectrum while minimizing jitter, without causing a change in the damping characteristics of the hybrid PLL. Thus, the bandwidth is adjustable independently of the damping.

It should be appreciated that the resistance value of 300 Ohms was selected for this example since a combination of a 300 Ohm resistor and a feed-forward delta f value of 210 MHz provides a damping factor of approximately 1, i.e. critically damped. Other combinations of resistance values and feed-forward delta f values may be selected to achieve the same or different damping factors as desired for the particular implementation.

In order to illustrate the operation of the hybrid PLL, the following is a mathematical derivation of a second order charge-pump PLL with feed-forward in accordance with the illustrative embodiments. First, the conventional RC PLL will be addressed, followed by the feed-forward PLL, and finally the hybrid RC-feed-forward PLL. The derivation is used to illustrate how the hybrid PLL stabilizes the damping factor with respect to the charge pump current while allowing a variability of frequency, i.e. loop bandwidth, similar to that in the feed-forward PLL architecture.

With regard to the conventional RC PLL, using the convention of Gardner "Charge-Pump Phase-Locked Loops," IEEE Trans. Comm., vol. COM-28, pp. 1849-1858, November 1980, the average error current over a cycle is determined as follows:

$$i_d = (I_p t_p)/T_i = (I_p \theta_e/\omega_i)/(2\pi/\omega_i) = I_p \theta_e/2\pi A, \quad (1)$$

where $I_p$ is the peak charge-pump current, as may be specified by the control input via the PMP bus, $t_p$ is the ON time of the phase detector output, $T_i$ and $\omega_i$ are the respective input period and radian frequency, and $\theta_e$ is the magnitude of the phase error between the input and the output of the PLL as determined by:

$$\theta_e = |\theta_i - \theta_o| \text{ rad}, \quad (2)$$

A conventional second-order charge pump with a loop filter impedance produces an oscillator control voltage given by:

$$V_c(s) = I_d(s)Z(s) = ((I_p\theta_e(s)/2\pi)R_2 + (I_p\theta_e(s)/2\pi Cs) V, \quad (3)$$

where $Z(s)$ is the loop filter impedance, $I_d(s)$ is the Laplace transform of $i_d(t)$ (equation 1), $R_2$ is the resistance value for the resistor in the loop filter, C is the capacitance value for the capacitor in the loop filter, and s is the frequency domain variable for the Laplace transform ($s=\sigma+\sigma\omega$). The first term is related to the instantaneous voltage step on the loop filter:

$$\Delta v_c = I_p R_2 V, \quad (4)$$

while the second term is related to the average value of the loop filter voltage. This voltage step produces an instantaneous frequency step as follows:

$$\Delta\omega = \Delta v_c K_0 = K_0 I_p R_2 \text{ rad/sec}, \quad (5)$$

where $K_0$ represents the VCO gain at the control input in rad/sec/V and $\Delta\omega$ is the instantaneous frequency change in rad/sec.

If $N_v$ and $N_f$ represent the divider values of a VCO divider, e.g., 550 in FIG. 5, and a feedback divider, e.g., 555 in FIG. 5, respectively, then $$\theta_0(s) = (K_0 V_c(s))/(sN_v N_f) \text{ rad}, \quad (6)$$

which combined with equation (3) above becomes $$\theta_0(s) = (K_0 I_p \theta_e(s))/(2\pi s N_v N_f)*(R_2 + 1/(sC)) \quad (7)$$

Other relationships that are important in the conventional case include the following "reference" relationships:

$$G(s) = K(s+\omega_2)/s^2 \quad (R1)$$

where $G(s)$ is the open loop transfer function, K is the loop gain, and $\omega_2$ is the frequency of the pole created by $R_2$ and C, and $$K = (K_0 I_p R_2)/(2\pi N_v N_f) \quad (R2)$$

$$\omega_2 = 1/(R_2 C) = 1/\tau_2 \quad (R3)$$

$$H(s) = K(s+\omega_2)/(s^2+Ks+K\omega_2) = (2\zeta\omega_n s+\omega_n^2)/(s2+2\zeta\omega_n s+\omega_n) \quad (R4)$$

where H(s) is the PLL transfer function, ζ is the PLL damping factor, and $\omega_n$ is the PLL natural frequency.

$$K=2\zeta\omega_n \quad (R5)$$

$$\omega_n^2=K\omega_2 \quad (R6)$$

$$1-H(s)=s^2/(s^2+Ks+K\omega_2) \quad (R7)$$

where $1-H(s)$ is an error function for the PLL.

$$\omega_n=sqrt(K_0I_p/(2\pi CN_vN_f)) \quad (R8)$$

$$\zeta=\tfrac{1}{2}\tau_2*sqrt(K_0I_p/(2\pi CN_vN_f)) \quad (R9)$$

where $\tau_2$ is the time constant of the $R_2$ and C combination, and $$\zeta=\tfrac{1}{2} R2*sqrt(K_0I_pC/(2\pi N_vN_f)) \quad (R10)$$

$$\zeta/\omega_n=\tau_2/2 \quad (R11)$$

$$|H(j\omega)|^2=K^2(\omega_2^2+\omega^2)/(K^2\omega_2^2+K^2\omega^2+\omega^4-2K\omega_2\omega^2) \quad (R12)$$

where $|H(j\omega)|^2$ is the square of the magnitude of the closed loop transfer function, $H(j\omega)$ is a complex function, i.e. R+jx where R is the real portion and jx is the imaginary portion, $\omega_2$ is the pole frequency, and $\omega$ is a frequency variable in rad/s.

$$\omega_{3dB}=\omega_n*sqrt(2\zeta^2+1+sqrt(4\zeta^4+4\zeta^2+2)) \quad (R13)$$

where $\omega_{3\,dB}$ is bandwidth (measured at −3 dB frequency relative to DC.

$$\theta_v=\Delta\Omega/K_v \quad (R14)$$

$$K_v=(K/R_2)*Z(0) \quad (R15)$$

where $\theta_v$ is a steady state phase error, $\Delta\Omega$ is a mistuning of frequency offset, $K_v$ is a DC loop gain, and $Z(0)$ is the filter impedance at DC.

If the PLL implementation does not include a physical resistor in the filter, such as in the feed-forward PLL architecture, it is useful to consider an equivalent resistance term $R_{eq}$ derived from the charge pump, filter, and VCO characteristics. To accommodate a resistorless filter, a special feed-forward current port on the VCO may be used with an auxiliary charge pump, current source, or voltage source providing a signal proportional to the error signal.

For the case where the VCO has a feed-forward current port with current gain $K_j$ (rad/sec/A), a feed-forward current $I_f(A)$ is injected by an auxiliary charge-pump such that:

$$\Delta\omega=K_jI_f \text{rad/sec}, \quad (8)$$

and $$R_{eq}=(K_jI_f)/(K_0I_p) \text{ Ohms}, \quad (9)$$

It is important to point out that since the equivalent resistance $R_{eq}$ is not a physical resistor, it is not a constant value, and in fact can vary significantly with the variation of loop parameters, e.g., $\Delta\omega$, $I_p$, $K_0$, $K_j$, $I_f$, and process tolerances.

For a resistorless design, the first term from equation (3) above becomes $$(I_pR_{eq}\theta_e(s))/2\pi=(\Delta\omega\theta_e(s))/(2\pi K_0) \quad (10)$$

and is removed from the expression for Vc(s) and added to the VCO output expression so that $$V_c(s)=((I_p\theta_e(s))/(2\pi Cs)) \quad (11)$$

and $$\theta_0(s)=(K_0I_p\theta_e(s))/(2\pi sN_vN_f)*(R_2+1/(sC))=(\Delta\omega\theta_e(s))/(2\pi sN_vN_f)+(K_0I_p\theta_e(s))/(2\pi s^2CN_vN_f) \quad (12)$$

It should be noted that although equation (11) is very different from equation (3) above, due to the R term being dropped, equation (12) is similar to equation (7) since the effect of the $R_{eq}$ term has been added through the VCO feed-forward port.

Solving for G(s), one gets:

$$G(s)=\theta_0(s)/\theta_e(s)=(\Delta\omega(s+(K_0I_p)/(\Delta\omega C)))/(2\pi s^2N_vN_f) \quad (13)$$

which can be rewritten as:

$$G(s)=K(s+\omega_{eq})/s^2 \quad (14)$$

where $\omega_{eq}$ is an equivalent pole frequency for the feed-forward case, and where $$K=\Delta\omega/(2\pi N_vN_f)=(K_0I_pR_{eq})/(2\pi N_vN_f) \text{ rad/sec} \quad (15)$$

and $$\omega_{eq}=(K_0I_p)/(\Delta\omega C)=1/R_{eq}C=1/\tau_{eq} \text{ rad/sec} \quad (16)$$

where $\tau_{eq}$ is an equivalent ttime constant for the feed-forward case, or $$\tau_{eq}=(\Delta\omega C)/(K_0I_p) \text{ sec} \quad (17)$$

These relationships shown in equations (14)-(17) are similar to the relationships found in conventional RC filter PLL implementations. For example, the expression for G(s) in the conventional RC filter PLL implementation is:

$$G(s)=K(s+\omega_2)/s^2$$

Since G(s) in equation (14) is similar to the conventional RC filter PLL implementation, the feed-forward expressions for the transfer function of the feed-forward PLL and error function of the feed-forward PLL are also similar to the conventional RC filter PLL implementation. The transfer function for the feed-forward case is:

$$H(s)=\theta_0(s)/\theta_i(s)=G(s)/(1+G(s))=K(s+\omega_{eq})/(s^2+Ks+K\omega_{eq})=(2\zeta\omega_ns+\omega_n^2)/(s^2+2\zeta\omega_ns+\omega_n^2) \quad (18)$$

where $\omega_n$ is the natural frequency of the feed-forward PLL and ζ is the damping factor of the feed-forward PLL, and wherein $K=2\zeta\omega_n$ and $\omega_n^2=K\omega_{eq}$. These relationships for K and $\omega^2$ are similar to the conventional RC filter PLL implementation. By substituting equations (15) and (16) into these relationships for K and $\omega_n^2$ one obtains:

$$\omega_n=sqrt(K\omega_{eq})$$

$$\omega_n=sqrt((K_0I_p)/(2\pi CN_vN_f)) \quad (19)$$

and $$\zeta=K/2\omega_n \quad (20)$$

$$\zeta=(\Delta\omega/2)sqrt(C/(2\pi N_vN_fK_0I_p)) \quad (20a)$$

$$\zeta=\tfrac{1}{2}R_{eq}*sqrt(K_0I_pC/(2\pi N_vN_f)) \quad (20b)$$

$$\zeta=\tfrac{1}{2} sqrt(K\tau_{eq}) \quad (20c)$$

$$\zeta=\tfrac{1}{2} \tau_{eq} sqrt(K_0I_p/(2\pi CN_vN_f)) \quad (20d)$$

The natural frequency in equation (19) is identical to the natural frequency of the conventional RC filter PLL implementation. The relationships in the equations (20b) and (20d) are similar to that of the conventional RC filter implementation, but differ by the fact that the $R_{eq}$ factor is not constant as the PLL parameters are varied, as discussed previously. The form of equation (20a) is preferred for describing the damping in the feed-forward case since $\Delta\omega$ is constant, not $R_{eq}$ or $\tau_{eq}$. As can be seen from equation (20a), especially when comparing it to similar relationships for the conventional RC PLL implementation, it is clear that the damping factor is a strong function of design parameters $K_0$ and $I_p$ (as well as C, $N_v$, and $N_f$), but the dependence on $sqrt(K_0 I_p)$ is directly proportional for the conventional RC filter PLL implementation yet inversely proportional for the feed-forward PLL implementation.

By substitution, one can see that the damping and natural frequency for the feed-forward PLL implementation are related by the loop time constant:

$$\zeta/\omega_n = \tau_{eq}/2 = 1/2\omega_{eq} \quad (21)$$

which is similar to the relationship of the conventional RC filter PLL implementation set forth above in equation (R11). The error function for the feed-forward PLL implementation is also similar to the conventional RC filter PLL implementation, represented by equation (R7), and is described by:

$$1 - H(s) = \theta_e(s)/\theta_i(s) = s^2/(s^2 + Ks + K\omega_{eq}) \quad (22)$$

The loop bandwidth for the feed-forward PLL implementation is also similar to the conventional RC filter PLL implementation represented by equation (R12), and is described by:

$$|H(j\omega)|^2 = K^2(\omega_{eq}^2 + \omega^2)/(K^2\omega_{eq}^2 + K^2\omega^2 + \omega^4 - 2K\omega_{eq}\omega^2) \quad (23)$$

which is set equal to 0.5 to solve for (o to give the ½ power frequency which is identical to the relationship in equation (R13):

$$\omega_{3dB} = \omega_n * sqrt(2\zeta^2 + 1 + sqrt(4\zeta^4 + 4\zeta^2 + 2)) \text{ rad/sec} \quad (24)$$

Solving the expression for $0 \leq \zeta \leq 1$ one sees that $1.55 \leq \omega_{3\,dB}/\omega_n \leq 2.25$. Thus, for most PLLs of interest, the loop bandwidth will be approximately twice the natural frequency.

From equation (22) the following relationship may be determined:

$$\theta_e(s) = s^2 \theta_i(s)/(s^2 + Ks + K\omega_{eq}) \quad (25)$$

and the steady-state phase error $\theta_v$ can be found using the final value theorem:

$$\theta_v = \lim_{t \to \infty} \theta_e(t) = \lim_{s \to 0} (s^3 \theta_i(s)/(s^2 + Ks + K\omega_{eq})) \text{rad} \quad (26)$$

For a frequency offset $\Delta\Omega$ (in rad/sec) between the input and the free-running (zero control voltage) frequency of the VCO, it is required that:

$$d\theta_i(t)/dt = \Delta\Omega\, u(t) \quad (27)$$

where $u(t)$ is a unit step function, or $$\theta_i(t) = \Delta\Omega\, t\, u(t) \quad (28)$$

hence $$\theta_i(s) = \Delta\Omega/s^2 \quad (29)$$

The relationship in equation (26) may now be rewritten as:

$$\theta_v = (2\pi N_v N_f \Delta\Omega)/(K_0 I_p Z(0)) = (R_{eq} \Delta\Omega)/(KZ)(0)) = \Delta\Omega/K_v \quad (30)$$

where $$K_v = (K/R_{eq})*Z(0) \text{ rad/sec} \quad (31)$$

wherein Kv is the DC loop gain. Equations (30) and (31) identical to the conventional RC filter PLL, see equations (R14) and (R15), and thus, one would expect that the static phase error $\theta_v$ would go to zero for both conventional and feed-forward approaches since for both implementations $Z(0) = \infty$.

As pointed out above, the damping factor is sensitive to the charge-pump current. If a PLL is constructed that uses a weighted combination of both RC filtering and feed-forward approaches, as in the hybrid PLL architecture of the present invention, the damping factor may be stabilized with respect to the charge-pump current variations. Combining the relationships in equations (R10) and equation (20b) one obtains:

$$\zeta = \tfrac{1}{2}(R_2^* + R_{eq}^*)*sqrt(K_0 I_p C/(2\pi N_v N_f)) \quad (32)$$

where the sum of the resistors is equal to the total effective damping resistance required:

$$R_2^* + R_{eq}^* = R_2 \text{ for the RC filter PLL implementation} \quad (33)$$

or $$R_2^* + R_{eq}^* = R_{eq} \text{ for the feed-forward PLL implementation} \quad (34)$$

substituting the equivalent resistance for a resistorless PLL design, i.e. $R_{eq}^* = \Delta\omega^*/(K_0 I_p)$, one obtains:

$$\zeta = \tfrac{1}{2}(R_2^* + \Delta\omega^*/(K_0 I_p))*sqrt(K_0 I_p C/(2\pi N_v N_f)) \quad (35)$$

and rearranging:

$$\zeta = \tfrac{1}{2}\, sqrt(C/(2\pi N_v N_f))\{R_2^* sqrt(K_0 I_p) + \Delta\omega^* sqrt(1/K_0 I_p)\} \quad (36)$$

Here it can be seen that an increase in the square root of $I_p$ will cause the term containing $R_2^*$ to increase and the term containing $\Delta\omega^*$ to decrease, effectively stabilizing the damping factor with respect to charge pump current. If the two terms are made equal:

$$R_2^* sqrt(K_0 I_p) = \Delta\omega^* sqrt(1/K_0 I_p) \quad (37)$$

then $$R_2^* = \Delta\omega^*/(K_0 I_p) = R_{eq}^* \quad (38)$$

and define $$R = R_2^* = R_2/2 = R_{eq}^* = R_{eq}^*/2 \quad (39)$$

such that $$\zeta = \tfrac{1}{2}(R_2/2 + R_{eq}/2)*sqrt((K_0 I_p C)/(2\pi N_v N_f)) = \tfrac{1}{2} R\, sqrt((K_0 I_p C)/(2\pi N_v N_f)) \quad (40)$$

which is similar to equations (R10) and (20b).

Thus, the illustrative embodiments provide a hybrid PLL circuit for obtaining stabilized dynamic response and independent adjustment of damping factor and loop bandwidth. The hybrid PLL circuit of the illustrative embodiments includes the RC filter elements of a conventional RC PLL and the feed-forward path from the output of the phase frequency detector to the VCO, as in a conventional feed-forward PLL. The hybrid PLL essentially enhances the performance of the conventional feed-forward PLL by providing the RC filter whose components can be weighted to provide a dynamic response that is significantly less sensitive to parameter variation and which allows loop bandwidth optimization without sacrificing damping.

The hybrid PLL takes advantage of the fact that the natural frequency relationships for the RC PLL and the feed-forward PLL are identical, but the damping factor for the RC PLL is directly proportional to the square root of the charge pump current while the damping factor for the feed-forward PLL is inversely proportional to the square root of the charge pump current. Thus, by creating a hybrid PLL which has both RC filtering and feed-forward operations, the mechanisms of the illustrative embodiments create a circuit with a damping factor in which components of the damping factor offset each other as the charge pump current is varied. As a result, the damping factor of the hybrid PLL may be made insensitive to charge pump current. Therefore, the damping factor and natural frequency/bandwidth can be set independently of each other.

Figure 7:
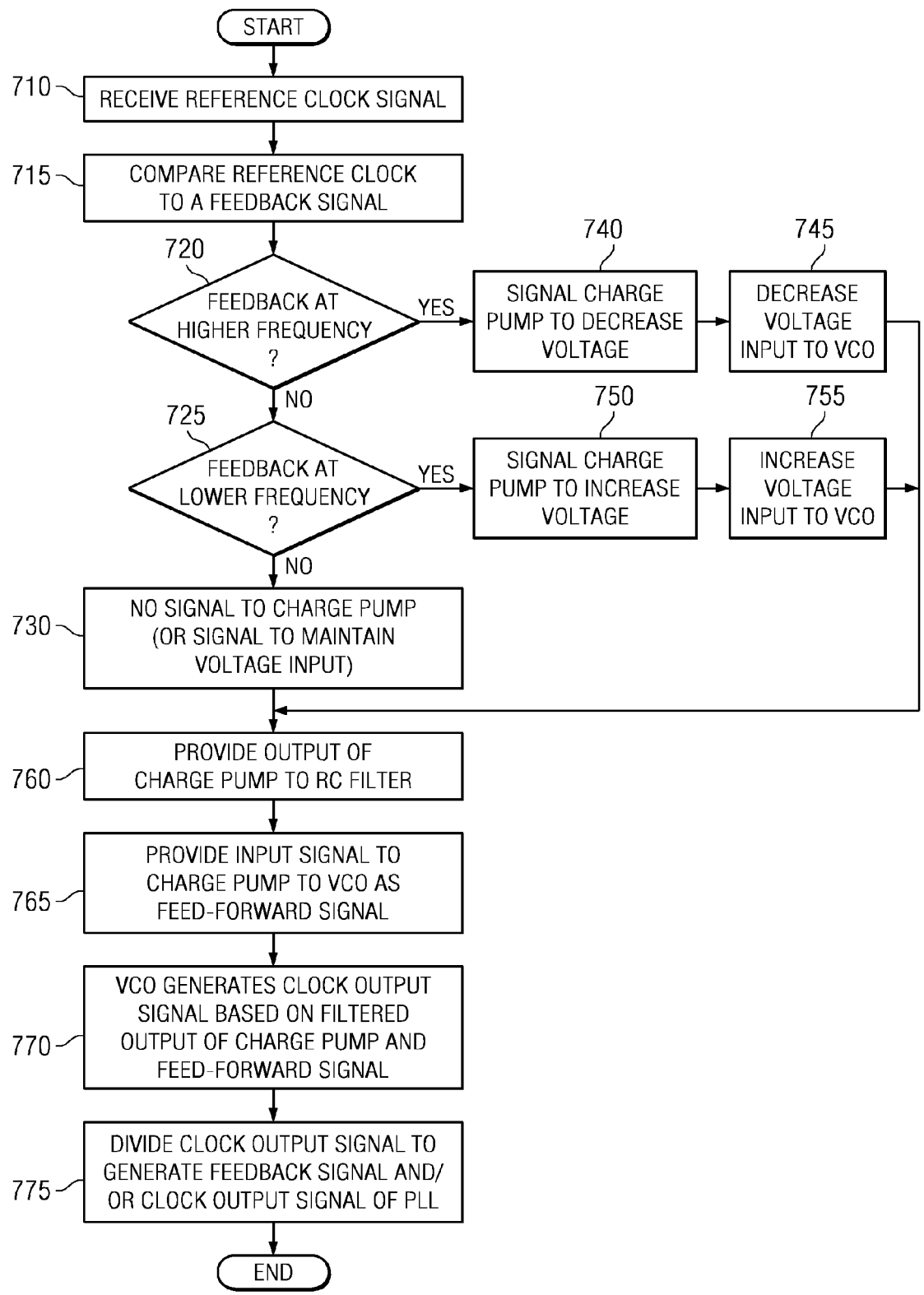
FIG. 7 is a flowchart outlining an exemplary operation of a hybrid PLL in accordance with one illustrative embodiment.

FIG. 7 is a flowchart outlining an exemplary operation of a hybrid PLL in accordance with one illustrative embodiment. It should be appreciated that while FIG. 7 will be described in terms of providing a clock signal output based on a reference clock signal input, the hybrid PLL of the illustrative embodiments is not limited to use in providing clock signals. To the contrary, any type of signal in which the operation of a PLL is desirable may be used with the hybrid PLL of the illustrative embodiments without departing from the spirit and scope of the present invention.

As shown in FIG. 7, the operation starts with the hybrid PLL receiving a reference clock signal (step 710). For example, the reference clock signal may include a signal from a bus or a multiplied signal from a bus coupled with a processor. The bus frequency or a multiple of that bus frequency may then be used as a reference clock to generate an internal clock signal for a processor with a hybrid PLL circuit such as the hybrid PLL circuit of FIG. 5 above.

After receiving the reference clock signal, the reference clock signal is compared with a feedback signal (step 715) that is indicative of the frequency of the clock signal output by the PLL circuit. If the feedback signal has a higher frequency than the reference signal (step 720) then a decrease signal is transmitted to a charge pump to decrease the voltage output of the charge pump (step 740). As a result, the charge pump reduces the voltage at the input of a VCO (step 745). The process then proceeds to step 760 as described below.

On the other hand, if the feedback signal is not a higher frequency than the reference clock signal (step 720), but is a lower frequency than the reference clock signal (step 725), then an increase signal is transmitted to the charge pump to increase the output voltage of the charge pump (step 750). The charge pump may then respond to the increase signal by increasing the voltage at the input of the VCO (step 755). The process then proceeds to step 760 as described below.

Otherwise, when the feedback signal matches the reference clock signal fairly closely, no increase or decrease signal may be transmitted to the charge pump (step 730). In some illustrative embodiments, a signal may be transmitted to the charge pump indicating that no change may be made to the output voltage of the charge pump.

The charge pump, based on the signal indicating to increase, decrease, or maintain the voltage at the input to the VCO, generates an output signal that is filtered by an RC filter and provided to the VCO control input (step 760). In addition to sending a signal to increase, decrease, or maintain the voltage at the input of the VCO to the charge pump, this signal is also provided as a feed-forward input to the VCO via a feed-forward line (step 765). Based on the feed-forward input and the filtered output of the charge pump, the VCO generates a clock output signal having a frequency that, preferably, more closely approximates the frequency of the reference clock signal (step 770). The clock output signal may be divided by a frequency divider to generate a feedback signal as well as a clock output signal of the hybrid PLL (step 775). Thereafter, the operation ends.

It should be noted that the above operation may be repeated in a periodic or continuous manner until a desired relationship between the reference clock signal and the clock output signal of the hybrid PLL is achieved. By virtue of the feed-forwarding of the input signal to the charge pump, to the VCO, as well as utilizing an RC filter, the characteristics of the hybrid PLL circuit, such as a weighting of the resistance/capacitance of the RC filter components, may be selected so as to provide a dynamic response that is significantly less sensitive to parameter variation and which allows loop bandwidth optimization without sacrificing damping. In other words, the circuitry arrangement of the hybrid PLL allows the characteristics of the PLL to be selected such that changes to damping factor of the PLL may be made independently of changes to the loop bandwidth.

Figure 8:
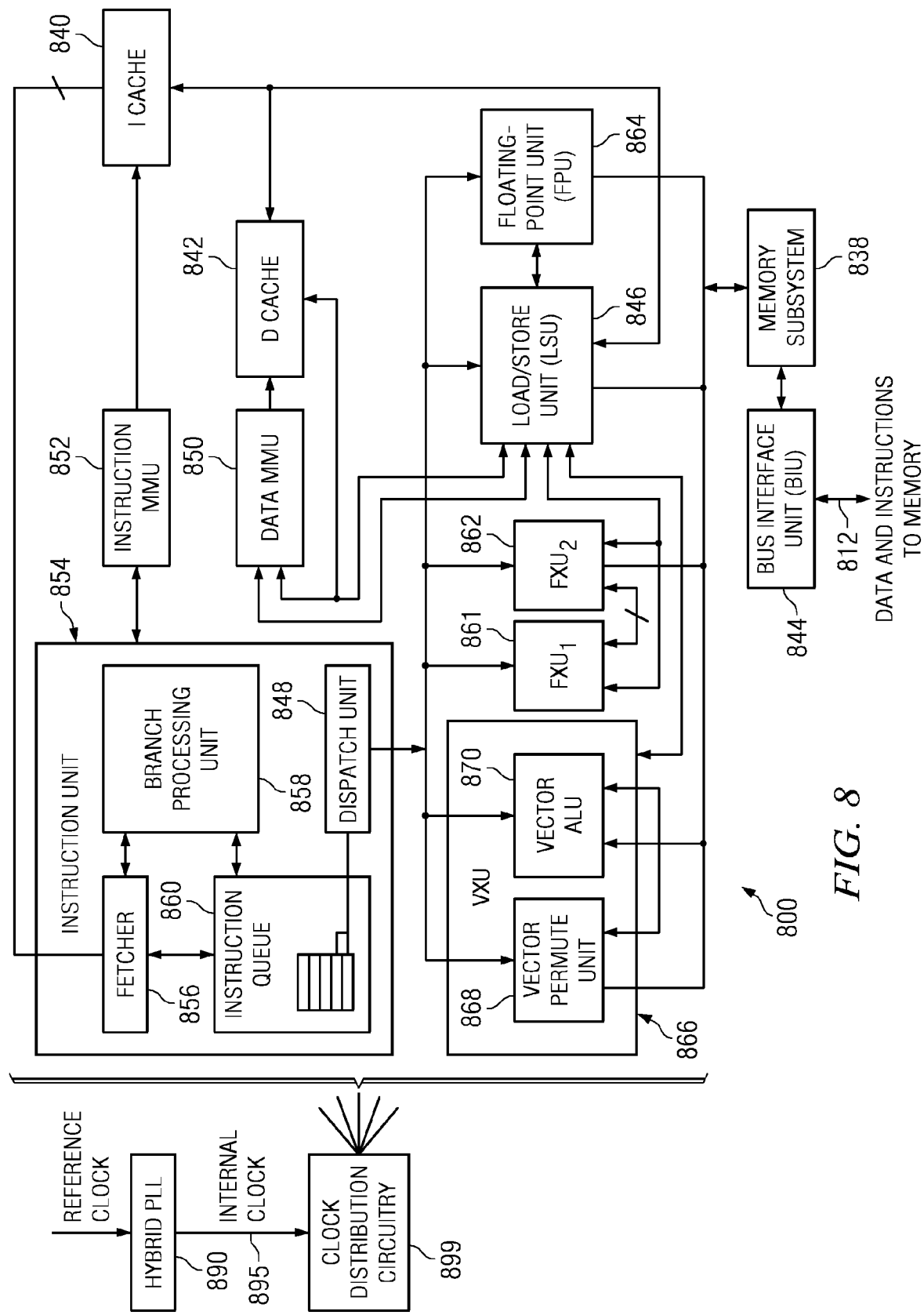
FIG. 8 is an exemplary diagram of a processor in which the hybrid PLL of the illustrative embodiments may be implemented.

The hybrid PLL of the illustrative embodiments may be implemented in a number of different types of circuit devices. One particular implementation of the hybrid PLL of the illustrative embodiments to note is in the generation of internal clock signals for processors of data processing devices. FIG. 8 is an exemplary diagram of a processor in which the hybrid PLL of the illustrative embodiments may be implemented. The depiction of the processor in FIG. 8 is provided as a high-level functional block diagram of selected operational blocks that may be included in a central processing unit (CPU) 800.

In one illustrated embodiment, CPU 800 includes internal instruction cache (I-cache) 840 and data cache (D-cache) 842 which are accessible to memory (not shown in FIG. 8) through bus 812, bus interface unit 844, memory subsystem 838, load/store unit (LSU) 846 and corresponding memory management units: data MMU 850 and instruction MMU 852. In the depicted architecture, CPU 800 operates on data in response to instructions retrieved from I-cache 840 through instruction dispatch unit 848. Dispatch unit 848 may be included in instruction unit 854 which may also incorporate fetcher 856 and branch processing unit 858 that controls instruction branching.

An instruction queue 860 may interface fetcher 856 and dispatch unit 848. In response to dispatched instructions, data retrieved from D-cache 842 by load/store unit 846 can be operated upon by one of fixed point unit (FXU) 861, FXU 862 or floating point execution unit (FPU) 864. Additionally, CPU 800 provides for parallel processing of multiple data items via vector execution unit (VXU) 866. VXU 866 may include a vector permute unit 868 that performs permutation operations on vector operands, and a vector arithmetic logic unit (VALU) 870 that performs vector arithmetic operations such as fixed-point and floating-point operations on vector operands.

Each unit, such as instruction unit 854, VXU 866, FXUs 861 and 862, LSU 846, and FPU 864, along the instruction pipelines, are enabled and synchronized by an internal clock signal 895. Such an internal clock signal 895 may be generated using an output of the hybrid PLL 890 of the illustrative embodiments and may be distributed to the various units via clock distribution circuitry 899. While the hybrid PLL 890 of the illustrative embodiments may be used to provide a clock signal for enabling and synchronizing the units of the processor 800, the hybrid PLL of the illustrative embodiments may be used to provide other types of signals as well depending upon the particular use to which the hybrid PLL is put.

The hybrid PLL circuit as described above may be part of the design for an integrated circuit chip, such as a chip in which the processor 800 of FIG. 8 may be provided, or the like. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design may then be converted into the appropriate format (e.g., GDSII) for the fabrication of photolithographic masks, which typically include multiple copies of the chip design in question that are to be formed on a wafer. The photolithographic masks may be utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other higher level carrier) or in a multichip package (such as a ceramic carrier that has either or both surface interconnections or buried interconnections). In any case, the chip may then be integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. Moreover, the end products in which the integrated circuit chips may be provided may include game machines, game consoles, hand-held computing devices, personal digital assistants, communication devices, such as wireless telephones and the like, laptop computing devices, desktop computing devices, server computing devices, or any other computing device.

Figure 9:
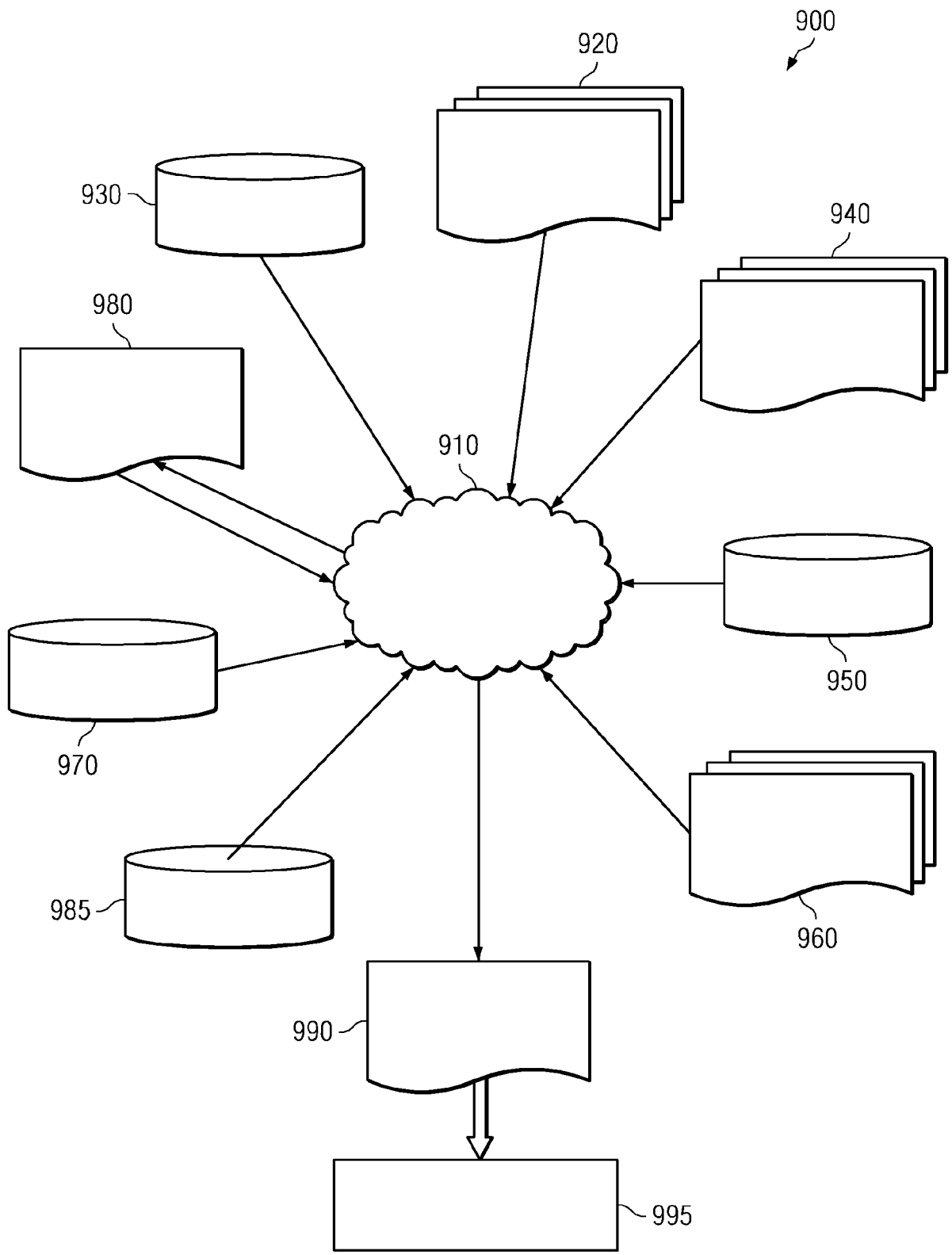
FIG. 9 is a flow diagram of a design process used in semiconductor design, manufacture, and/or test.

FIG. 9 shows a block diagram of an exemplary design flow 900 used for example, in semiconductor IC logic design, simulation, test, layout, and manufacture. Design flow 900 includes processes and mechanisms for processing design structures to generate logically or otherwise functionally equivalent representations of the embodiments of the invention shown in FIGS. 5 and 8. The design structures processed and/or generated by design flow 900 may be encoded on machine-readable transmission or storage media to include data and/or instructions that when executed or otherwise processed on a data processing system generate a logically, structurally, or otherwise functionally equivalent representation of hardware components, circuits, devices, or systems.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 5 and 8. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 5 and 8 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium. The medium may be a non-volatile storage medium such as a magnetic or optical disk drive, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include modules for performing standard circuit design processes such as timing analysis, verification, design rule checking, place and route operations, etc.

Design process 910 employs and incorporates well-known logic and physical design tools such as HDL compilers and simulation model build tools to process design structure 920 together with some or all of the depicted supporting data structures to generate a second design structure 990. Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 5 and 8. In one embodiment, design structure 990 may comprise a compiled, executable HDL simulation model that functionally simulates the devices shown in FIGS. 5 and 8.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data processed by semiconductor manufacturing tools to fabricate embodiments of the invention as shown in FIGS. 5 and 8. Design structure 990 may then proceed to a stage 995 where, for example, design structure 990 proceeds to tape-out, is released to manufacturing, is released to a mask house, is sent to another design house, is sent back to the customer, etc.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A system comprising:
a non-transitory computer readable medium comprising a design structure for implementing a machine executable representation of an integrated circuit; and
a computing device that executes instructions that cause the computer device to retrieve the design structure from the non-transitory computer readable medium and process the design structure to generate:
a first design structure element representing a phase frequency detector;
a second design structure element representing a charge pump coupled to the phase frequency detector;
a third design structure element representing a filter coupled to the charge pump, the filter comprising a resistor;
a fourth design structure element representing an oscillator coupled to the filter; and
a fifth design structure element representing a feed-forward path coupled to the phase frequency detector and the oscillator, wherein the feed-forward path, in the representation of the integrated circuit, is a first connection that directly couples an output of the phase frequency detector to a first input of the oscillator and is parallel to a second connection between the output of the phase frequency detector and a second input of the oscillator, wherein the second connection, in the representation of the integrated circuit, comprises the charge pump and the filter.

2. The system of claim 1, wherein the design structure is configured such that the resistor and the feed-forward path permit a damping factor and a bandwidth of the phase locked loop circuit to be independently set.

3. The system of claim 1, wherein the filter further comprises a capacitor coupled to the resistor.

4. The system of claim 1, wherein the design structure is configured such that:
the phase frequency detector receives as inputs a reference signal and a feedback signal, and
the phase frequency detector generates and provides a control signal input to the charge pump to thereby increase or decrease a current of the charge pump based on a detected difference in at least one of phase or frequency of the reference signal and the feedback signal.

5. The system of claim 4, wherein the design structure is configured such that the control signal input generated by the phase frequency detector is provided to the oscillator via the feed-forward path and to the charge pump.

6. The system of claim 1, wherein the design structure is configured such that the resistor and the feed-forward path generate components of a damping factor function, used in the determination of the damping factor of the phase locked loop circuit, that offset each other as charge pump current is varied.

7. The system of claim 1, wherein the design structure is configured such that the damping factor of the phase locked loop circuit is insensitive to charge pump current due to the inclusion of both the feed-forward path and the resistor in the filter.

8. The system of claim 1, wherein the design structure is configured such that the phase locked loop circuit provides a frequency modulation for a spread spectrum integrated circuit device.

9. The system of claim 8, wherein the design structure is configured such that the integrated circuit device is a processor and the clock signal output is a core clock signal for the processor.

10. The system of claim 1, wherein the design structure is configured such that the oscillator provides a clock signal output to an integrated circuit device.

11. The system of claim 1, wherein the design structure comprises a netlist.

12. The system of claim 1, wherein the design structure resides on a storage medium as a data format used for the exchange of layout data of integrated circuits.

13. A system comprising:
a non-transitory computer readable medium comprising a design structure, said design structure comprising elements that, when processed in a computer-aided design system, generates a machine-executable representation of a phase locked loop circuit; and
a data processing system that executes instructions that cause the data processing system to retrieve the design structure from the non-transitory computer readable medium and process the design structure to generate:
a first design structure element representing a phase frequency detector;
a second design structure element representing a charge pump coupled to the phase frequency detector;
a third design structure element representing a filter coupled to the charge pump, the filter comprising a resistor;
a fourth design structure element representing an oscillator coupled to the filter; and
a fifth design structure element representing a feed-forward path coupled to the phase frequency detector and the oscillator, wherein the feed-forward path, in the representation of the integrated circuit, is a first connection that directly couples an output of the phase frequency detector to a first input of the oscillator and is parallel to a second connection between the output of the phase frequency detector and a second input of the oscillator, wherein the second connection, in the representation of the integrated circuit, comprises the charge pump and the filter.

14. The system of claim 13, wherein the design structure comprises a netlist.

15. The system of claim 13, wherein the design structure resides on storage medium as a data format used for the exchange of layout data of integrated circuits.

16. A system comprising:
a non-transitory computer readable medium comprising a hardware description language (HDL) design structure encoded on a non-transitory machine-readable data storage medium, said HDL design structure comprising elements that, when processed in a computer-aided design system, generates a machine-executable representation of a phase locked loop circuit; and a processor that executes instructions that cause the processor to retrieve the design structure from the non-transitory computer readable data storage medium and process the design structure to generate:
   a first design structure element representing a phase frequency detector;
   a second design structure element representing a charge pump coupled to the phase frequency detector;
   a third design structure element representing a filter coupled to the charge pump, the filter comprising a resistor;
   a fourth design structure element representing an oscillator coupled to the filter; and
   a fifth design structure element representing a feed-forward path coupled to the phase frequency detector and the oscillator, wherein the feed-forward path, in the representation of the integrated circuit, is a first connection that directly couples an output of the phase frequency detector to a first input of the oscillator and is parallel to a second connection between the output of the phase frequency detector and a second input of the oscillator, wherein the second connection, in the representation of the integrated circuit, comprises the charge pump and the filter.

17. The system of claim 16, wherein the design structure comprises a netlist.

18. The system of claim 16, wherein the design structure resides on storage medium as a data format used for the exchange of layout data of integrated circuits.

19. A method in a computer-aided design system, having at least one processor and a memory, for generating a functional design model of a phase locked loop circuit, said method comprising:
   generating, in the computer-aided design system, a functional computer-simulated representation of a phase frequency detector;
   generating, in the computer-aided design system, a functional computer-simulated representation of a charge pump coupled to the phase frequency detector;
   generating, in the computer-aided design system, a functional computer-simulated representation of a filter coupled to the charge pump, the filter comprising a resistor;
   generating, in the computer-aided design system, a functional computer-simulated representation of an oscillator coupled to the filter; and
   generating, in the computer-aided design system, a functional computer-simulated representation of a feed-forward path coupled to the phase frequency detector and the oscillator, wherein the feed-forward path, in the representation of the integrated circuit, is a first connection that directly couples an output of the phase frequency detector to a first input of the oscillator and is parallel to a second connection between the output of the phase frequency detector and a second input of the oscillator, wherein the second connection, in the representation of the integrated circuit, comprises the charge pump and the filter.

* * * * *